United States Patent
Huitema et al.

(10) Patent No.: US 7,384,814 B2
(45) Date of Patent: Jun. 10, 2008

(54) FIELD EFFECT TRANSISTOR INCLUDING AN ORGANIC SEMICONDUCTOR AND A DIELECTRIC LAYER HAVING A SUBSTANTIALLY SAME PATTERN

(75) Inventors: Hjalmar Edzer Ayco Huitema, Eindhoven (NL); Bart-Hendrik Huisman, Eindhoven (NL)

(73) Assignee: Polymer Vision Limited, Eindhoven (NL)

( * ) Notice: Subject to any disclaimer, the term of this patent is extended or adjusted under 35 U.S.C. 154(b) by 59 days.

(21) Appl. No.: 10/557,623

(22) PCT Filed: May 13, 2004

(86) PCT No.: PCT/IB2004/050680

§ 371 (c)(1),
(2), (4) Date: Nov. 17, 2005

(87) PCT Pub. No.: WO2004/107473

PCT Pub. Date: Dec. 9, 2004

(65) Prior Publication Data

US 2006/0223218 A1    Oct. 5, 2006

(30) Foreign Application Priority Data

May 20, 2003    (EP)    ................................. 03101430

(51) Int. Cl.
*H01L 21/00*    (2006.01)
(52) U.S. Cl. .................. 438/99; 438/725; 257/E51.006
(58) Field of Classification Search .................. 438/99, 438/725; 257/E51.006
See application file for complete search history.

(56) References Cited

U.S. PATENT DOCUMENTS

| 5,500,537 | A  | * | 3/1996 | Tsumura et al. ............... 257/40 |
| 6,335,539 | B1 |   | 1/2002 | Dimitrakopoulos et al. |
| 6,764,885 | B2 | * | 7/2004 | Huang et al. ................ 438/161 |
| 6,891,237 | B1 | * | 5/2005 | Bao et al. ................... 257/410 |
| 7,238,961 | B2 | * | 7/2007 | Bernds et al. ................. 257/40 |
| 2004/0161873 | A1 | * | 8/2004 | Dimitrakopoulos et al. .. 438/99 |
| 2006/0220126 | A1 | * | 10/2006 | Huisman et al. ............ 257/347 |

FOREIGN PATENT DOCUMENTS

WO    WO-IB03/01062    6/2003

* cited by examiner

*Primary Examiner*—W. David Coleman
(74) *Attorney, Agent, or Firm*—Leydig, Voit & Mayer, Ltd

(57) ABSTRACT

Provided is a method of manufacturing a field effect transistor with an organic semiconductor, and particularly a device comprising a plurality of field effect transistors with an interconnect structure. Herein, use is made of three photolithographical masks for four layers. Thereto, the transistor is provided in a top-gate structure, and the organic semiconductor layer (307) and the dielectric layer (309) are structure and patterned together. The semiconductor layer (307) and the dielectric layer (309) may be removed from areas not associated with field effect transistors (300) or with crossing conductors of the first and second conductor layer (303, 305, 501).

10 Claims, 4 Drawing Sheets

Prior Art

FIELD EFFECT TRANSISTOR INCLUDING AN ORGANIC SEMICONDUCTOR AND A DIELECTRIC LAYER HAVING A SUBSTANTIALLY SAME PATTERN

The invention relates to an a method of manufacturing an electronic device, in which method at least one field effect transistor comprising an organic semiconductor layer is provided on a substrate.

The invention also relates to an electronic device comprising a plurality of field effect transistors comprising an organic semiconductor layer and an interconnect structure so as to connect the transistors mutually and/or to an output terminal.

It has for many years been known to manufacture electronic semiconductor components such as bipolar and field effect transistors using semiconductor materials such as silicon, germanium and gallium arsenide. Specifically, integrated circuits comprising many electronic components are manufactured by depositing conductive, semiconductive and dielectric layers on a substrate.

In recent years, it has been realized that some organic materials, such as for example pentacene, may exhibit semiconductor properties. Semiconductor components, arrangements and circuits comprising organic semiconductors promise a number of advantages over traditional semiconductor based structures including mechanical flexibility, solution processability, and low temperature processing. Accordingly, much research has been undertaken in the field of organic semiconductors and the manufacturing of semiconductor components and circuits based on organic semiconductors.

Currently, organic semiconductor transistors are made by standard photolithographic methods. FIG. 1 illustrates the structure 100 of an organic semiconductor in accordance with the prior art. The manufacturing of the semiconductor comprises a minimum of three or four mask steps. The semiconductor structure 100 is produced on a substrate 101. First the gate layer 103 (usually a metal layer, for example gold) is deposited on the substrate 101 and patterned by photolithography. Then a dielectric layer 105 is deposited (an organic HPR504 layer for example) and patterned in order to make holes for vertical interconnects. The third layer 107, 109 is a source-drain layer (for example made of gold) which is patterned to form the source 107 and the drain 109 of the transistor. Finally an organic semiconductor 111 is deposited. The gate-source and gate-drain overlap is usually 5 µm, which is the same size as is commonly used for the channel length (i.e. the gap between the source and the drain).

Structuring of the semiconductor is desired in order to access the electrodes of the gate layer. Furthermore, structuring of the semiconductor layer is preferred in order to reduce leakage current and to avoid the generation of spurious transistors formed by interconnects of the gate layer 103 crossing semiconductor areas between electrodes of the source-drain layer 107, 109. However, the structuring of the semiconductor requires an additional structuring step thereby making the manufacturing process a four mask process.

Deposition of the various layers is generally a cheap and simple process. For example, spin-coating may be used to cheaply and efficiently distribute a dielectric or semiconductor layer. However, structuring generally uses lithographic techniques which are relatively expensive and complicated lithographic techniques. Accordingly, a reduction in the manufacturing expense and complexity would be advantageous.

The conventional method of manufacturing of an organic field effect transistor comprises processing the source-drain layer between deposition of the dielectric and the semiconductor layers. This has a tendency of introducing impurities between the dielectric and semiconductor layer thereby reducing the performance of the transistor. Accordingly, an improved performance and reduced amount of impurities would be advantageous.

An electronic device comprising field effect transistors, such as an integrated circuit, manufactured by the conventional approach typically has one or more layers (e.g. the dielectric layer or the semiconductor layer) extending over the entire area of the arrangement This significantly reduces the mechanical reliability of the structure causing increased mechanical stress and reduced mechanical flexibility. Accordingly, an electronic device with field effect transistors and a manufacturing process achieving improved mechanical characteristics and robustness would be advantageous.

Accordingly, the invention preferably seeks to mitigate, alleviate or eliminate one or more of the above mentioned disadvantages singly or in any combination.

According to a first aspect of the invention, there is provided a method of manufacturing a field effect transistor arrangement on a substrate; the method comprising the steps of: applying a patterned first conductor layer on the substrate; applying an organic semiconductor layer on the first conductor layer; applying a dielectric layer on the semiconductor layer; patterning the semiconductor layer and the dielectric layer together; and applying a patterned second conductor layer on the patterned dielectric layer.

The application of the patterned conductor layers may either be directly by application of the conductive material in the desired patterns (e.g. by evaporation through a shadow mask) or may be a two step process of depositing the conductive material followed by a step of patterning the layer. Patterning or structuring of a layer generally includes any suitable means of providing a desired structure or pattern to the layer.

The invention allows for a field effect transistor arrangement to be manufactured having both a structured dielectric layer and semiconductor layer while only using three masks. Specifically, by structuring the layers such that the semiconductor and dielectric layer may patterned together, only a single patterning step is required for patterning these layers. In particular, only a single photolithographic step is required for patterning the semiconductor and dielectric layer thereby reducing the number of photolithographic steps required to achieve a patterned or structured semiconductor and dielectric layer.

Thus, the invention enables a 3-mask process for organic electronics while achieving structuring of both dielectric and semiconductor layer. As manufacturing of organic electronics combines cheap deposition techniques with relatively expensive photo-lithography, reduction of the mask count is very important and leads to a significant manufacturing cost reduction.

It is an advantage of the invention that the dielectric layer can be deposited directly on the semiconductor layer before any patterning is performed. This allows for a very clean interface between these layers thereby improving the mobility in the semiconductor and thus the performance of the field effect transistor. Specifically, the dielectric and semiconductor layer may be deposited immediately after each other and in the same environment. This provides for a significantly improved integrity of the dielectric-semiconductor interface with significantly reduced levels of impurities.

The structuring of the dielectric and semiconductor layer furthermore allows for an increased mechanical flexibility and reduced mechanical stress. This allows for an improved reliability. Whereas the known method results in a structure, in which the semiconductor layer and particularly the dielectric layer are at some areas absent, the method of the invention results therein that the dielectric layer and the semiconductor layer are at some areas present.

It is a further advantage of the method of the invention that a dielectric material with a relatively high dielectric constant may be used for the dielectric layer. Whereas in the prior art method, the dielectric layer functions as a glamorization layer and hence as the insulation between different transistors, the dielectric layer as provided in the method of invention has a function in the transistor and at the crossings of limited area.

In a preferred embodiment of the method of the invention the step of patterning the semiconductor layer and the dielectric layer comprises removing the organic semiconductor layer and the dielectric layer from areas not associated with the at least one field effect transistor and from areas not associated with crossing conductors of the first and second conductor layer.

This significantly reduces the mechanical stress and increases the resilience and/or flexibility of the field effect transistor arrangement. Specifically, the semiconductor and dielectric layer may be removed for a significant proportion of the total area and the mechanical properties of the structure may be predominantly determined by the mechanical properties of the substrate. Specifically, the invention may allow for flexible or bendable structures or structures having increased resistance to vibrations and mechanical shocks.

It is observed that a vertical interconnect is formed at areas where the first and second conductor layer overlap and the semiconductor layer and the dielectric layer are removed. These vertical interconnects are vital so as to provide the required connections from and to the individual transistors. Also, the vertical interconnect allows to interconnect the drain and the gate electrode of one transistor, so that the transistor can be used as a diode, i.e. for a rectifying function.

In a further, preferred embodiment the said areas associated with a field effect transistor and/or the said areas associated with crossing conductors include protection zones providing a minimal lateral distance between a first conductor in the first conductor layer and a second conductor in the second conductor layer.

As a result of the method of the invention, the semiconductor layer extends to the side faces of the semiconductor-dielectric islands. A second conductor extending beyond the island may therefore get in contact to the semiconductor layer. This may lead to a leakage current between this second conductor and a first conductor underlying the semiconductor-dielectric islands. The provision of protection zones enlarges the lateral distance between this first and this second conductor. As the leakage current depends inversely proportional to the lateral distance, it is considerable reduced by these protection zones. The protection zone will generally have a length in the order of 0.5 to 10 micrometers, preferably 1-5 micrometers. The resulting shape of the semiconductor-dielectric island, as seen normal to the substrate plane is then elongated. In another embodiment, the size of the protection zones is chosen deliberately, so as to provide a resistance of desired magnitude between the first and the second conductor.

In one embodiment, the organic semiconductor layer is a polymeric semiconductor layer. Suitable polymeric semiconductor layers include without limitation polyarylamines, polyfluorenes, polythienylene-vinylenes, polyphenylene-vinylenes, polyfuranylene-vinylenes, polythiophenes, particularly poly-3(alkyl)thiophenes. These semiconductor materials may be substituted with desired alifatic and aromatic side groups so as to improve the processing thereof. Furthermore, the polymeric semiconductors may be networks and copolymers. These networks and copolymers may comprise groups which do not exhibit semiconducting behavior. Suitable examples are described in the non-prepublished application WO-IB03/01062 (PHNL020257).

Alternatively, the organic semiconductor is an oligomeric compound, such as an oligothiophene and an oligocene, wherein the number of repeating units is generally between 3 and 15. Particularly preferred therewith is the Oligocene with 5 repeating units, generally known as pentacene. Also these molecules may have desired side groups, as known per se, and may be included in polymeric networks and/or copolymers as described in the above-mentioned application. Pentacene is particularly preferred in view of its mobility. Further oligomeric and polymeric organic semiconductors are known to the sldiled person.

It will be understood that a field effect transistor generally comprises a source and a drain electrode in the first conductor layer adjacent to the semiconductor layer, and a gate electrode in the second conductor layer which is separated from the semiconductor layer through the dielectric layer. Particularly, a perpendicular projection of the gate electrode onto the semiconductor layer has an overlap with the channel in this semiconductor layer between the source and drain electrode. The gate may for example be a metal layer, such as gold, or may e.g. be an organic conductor.

According to another feature of the invention, the step of applying an organic semiconductor layer on the first conductor layer comprises applying an organic semiconductor or a precursor thereof by spin coating. This provides for a particularly simple and low cost manufacturing process. The use of a precursor molecule is a well-known technique in the field. The precursor may be converted in the semiconductor material after its deposition.

According to another feature of the invention, the step of applying an dielectric layer on the first conductor layer comprises applying a dielectric material by spin coating. This provides for a particularly simple and low cost manufacturing process. Specifically, the dielectric and semiconductor layers may both be provided by spin coating in the same spin coating device thereby allowing for a high integration and high purity of the interface between the dielectric layer and the semiconductor layer. The cost and complexity of the manufacturing process may be kept low by only using one mask step for patterning the dielectric and semiconductor layers after these have been applied by the low cost spin coating operation.

In the case that a precursor is applied for the semiconductor, which needs conversion at increased temperature, this conversion may take place after provision of the dielectric layer. This is particularly suitable in the case that the dielectric layer also needs a heat treatment (for instance after irradiating it with actinic readiation). Then, both heat treatments may be combined.

Patterning of a layer after deposition of this layer generally involves the provision of a mask followed by etching.

It is preferred that the step of patterning the semiconductor layer and the dielectric layer comprises a photolithographic process. Herein, a layer is patterned using actinic radiation, so as to effect chemical changes in the irradiated layer. This layer can afterwards be used as an etch mask. A photolithographic process is particularly suitable for patterning the dielectric and semiconductor layers together.

It is herein particularly preferred that the dielectric layer functions as a photoresist layer for the lithographic process. Hence, there is no additional mask needed in the photolithographic process. The dielectric layer preferably comprises a material that may also function as a photoresist. Examples of suitable materials include HPR504 or SC100 (Olin Hunt). By using the same layer as both an dielectric layer and a photoresist layer, the need for an application of an additional photoresist layer is avoided and thus the complexity and cost of the manufacturing process may be reduced further. Besides, the dielectric layer comprises preferably an organic material, so as to have excellent flexibility. If a photoresist is provided on top of this dielectric layer of organic material, a very selective etchant is needed to remove the photoresist mask afterwards without affecting the dielectric layer negatively.

According to another feature of the invention, the method of manufacturing further comprises the step of applying a protective layer. The protective layer is preferably added on top of the second conductor layer and may preferably comprise materials such as polystyrene, Zeonex, PMMA, Polycarbonate, and PVDF. The protective layer provides additional protection of the structure and increased mechanical robustness. For a display arrangement, the protective layer is preferably substantially transparent. In a preferred embodiment of the invention, the electronic device comprises a plurality of field effect transistors. Preferably also other components including both semiconductor components, including memory units and resistive components are present All of these may be provided in the four layer stack of first and second conductor layer, dielectric layer and semiconductor layer. However, further layers may be present in addition hereto. The manufacturing process thus allows complicated arrangements with complex functions to be manufactured by a low complexity and cheap manufacturing process. Specifically, the device may be an integrated circuit.

In a further preferred embodiment, the electronic device is or comprises a display arrangement. A display may thus be manufactured by a simple and cheap manufacturing process. The field effect arrangement (e.g. the stack of layers in which the field effect transistors are provided) will typically form only part of the display. The patterning of both the dielectric and semiconductor layer may provide for improved mechanical properties including reduced stress and increased flexibility. Specifically, a bendable display may be manufactured.

In an even further embodiment, the substrate is substantially transmissive. This allows for a display arrangement wherein a displayed picture may be viewed through the substrate and the substrate is accordingly preferably sufficiently transparent for a picture to be viewed through the substrate.

The choice of the electro-optical layer in the display basically determines the operation principle of the display. A well-known electro-optical layer is a layer of liquid-crystalline material. It is however preferred that an electrophoretic electro-optical layer is provided. This provides for a particularly suitable, simple and low cost method of manufacturing a display. Particularly, the rate at which the display has to be refreshed, is lower for electrophoretic displays than for liquid crystalline displays, and hence the energy consumption is reduced. The display is in this sense very suitable for use in mobile telecommunication applications, where power management is an absolute must. A further feature of the electrophoretic display is that the display quality from viewing angles smaller than 90 degrees, is quite good. This is important for a bendable display, in which this viewing angle will be more often unequal to 90 degrees with respect to the plane of the display.

According to a second aspect of the invention, there is provided an electronic device comprising a plurality of field effect transistors comprising an organic semiconductor layer and an interconnect structure so as to connect the transistors mutually and/or to an output terminal, which field effect transistors are provided in a stack comprising: a patterned first conductor layer applied on the substrate; an organic semiconductor layer applied on the first conductor layer, an dielectric layer applied on the semiconductor layer; a patterned second conductor layer applied on the dielectric layer. According to the invention, the semiconductor layer and the dielectric layer are patterned according to a substantially identical pattern. As a consequence, the interface of the semiconductor and the dielectric layer is very pure, and therewith provides an improved transistor performance, particularly an improved carrier mobility.

In the device of the invention the semiconductor and the dielectric layer are preferably removed from areas from areas not associated with the at least one field effect transistor and from areas not associated with crossing conductors of the first and second conductor layer. This leads thereto, that the device has an improved mechanical performance due to the patterning of both the dielectric and semiconductor layer.

These and other aspects, features and advantages of the invention will be apparent from and elucidated with reference to the embodiment(s) described hereinafter.

An embodiment of the invention will be described, by way of example only, with reference to the drawings, in which FIG. 1 illustrates the structure of an organic semiconductor in accordance with the prior art;

Figure 1:
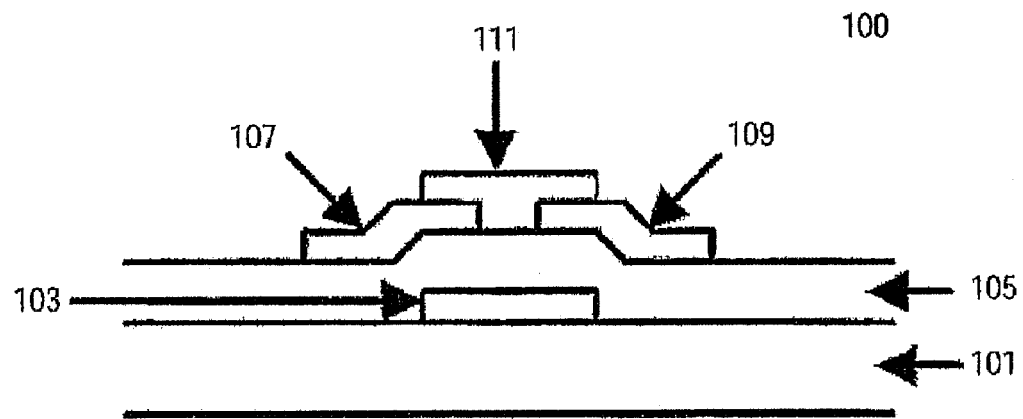
Figure 2:
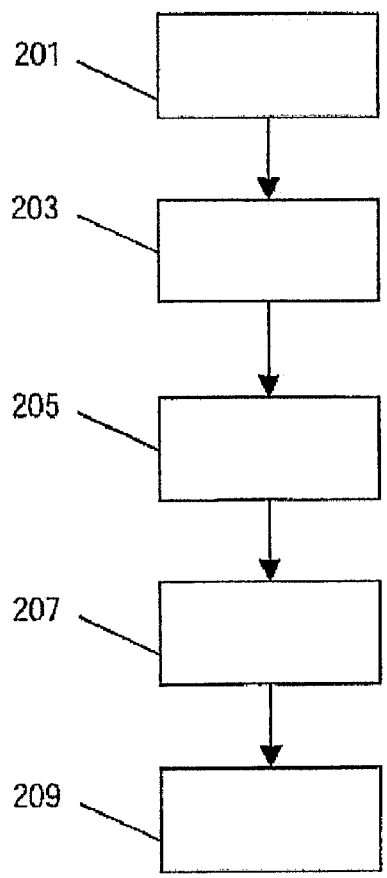
FIG. 2 illustrates a flow chart of a method of manufacturing a field effect transistor arrangement in accordance with an embodiment of the invention.

FIG. 2 illustrates a flow chart of a method of manufacturing an organic field effect transistor (FET) arrangement in accordance with a preferred embodiment of the invention. The organic field effect transistor is provided on a substrate, which was glass in the experiment used for testing. Usually, this substrate is attached to a carrier which provides the support and mechanical stability for the FET structure. Then, the carrier is made of glass and the substrate is in this case a polymeric foil, for instance made of polyimide. The substrate may be removed from the carrier in suitable manner. Preferred is a method wherein the substrate is attached to the carrier with an UV-releasable adhesive. Detachment occurs then on irradiation of the UV-releasable adhesive through the—transparent—carrier.

In step 201 of the manufacturing process a structured or patterned first conductor layer is applied to the substrate. In the preferred embodiment, a gold layer is applied to the substrate followed by a subsequent lithographic patterning of the gold layer as is well known in the art In the preferred embodiment, the sources and drains of FETs are formed by the first conductor layer, and the patterning of the first conductor layer is such as to provide source and drain electrodes at the appropriate locations. In addition, the first conductor layer provides a first interconnect layer for forming the interconnects required for implementing an electronic circuit.

In step 203, an organic semiconductor layer is applied on the first conductor layer. In the preferred embodiment, the semiconductor layer is thus applied on top of the first conductor layer. The applied layer covers the substrate area and is thus in contact with the first conductor layer and directly with the substrate where the first conductor has been removed by the patterning.

In the preferred embodiment, the organic semiconductor layer is pentacene (0.25 weight %, with 10% polystyrene added to the solution), which is preferably applied to the substrate as a precursor. The precursor used is 6,13-dihydro-6,13-(2,3,4,5-tetrachloro-2,4-cyclohexadieno)-pentacene. It is applied on first conductor layer by spin coating. Following spin coating, conversion of the precursor into pentacene is performed for 10 seconds at 200° C. on a hot plate.

In step 205 of the manufacturing process, a dielectric layer is applied on top of the semiconductor layer. The dielectric layer is preferably applied by spin coating and preferably in the same operation as the application of the semiconductor layer in step 203. The dielectric layer is in the preferred embodiment a dielectricum having suitable characteristics and may preferably be a photoresist (such as HPR504).

In the case that a precursor of the semiconductor is applied, the conversion into the actual semiconductor may take place after the dielectric layer has been applied. In case that the dielectric layer, particularly a photoresist, needs curing after application (and photolithographic treatment), the conversion of the precursor into the semiconductor and the curing of the dielectric layer may be combined in a single treatment. This heating treatment may comprise heating at several temperatures for different periods.

Following the application by spin coating, the dielectric layer is, in the preferred embodiment, dried on a hot plate for 30 sec. at 90° C.

Figure 3:
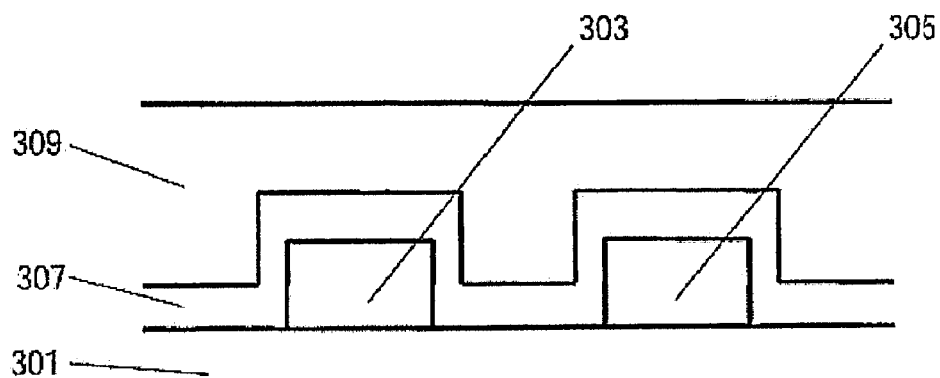
FIG. 3 shows a cross section of a field effect transistor structure following application of an dielectric and semiconductor layer in accordance with an embodiment of the invention.

FIG. 3 shows a cross section of a FET structure 300 following application of the dielectric and semiconductor layer in accordance with an embodiment of the invention. Hence, FIG. 3 illustrates a cross section of the FET structure following step 205.

As illustrated in FIG. 3, a source 303 and a drain 305 is formed by the first conductor layer 303, 305 formed on top of the substrate 301. The semiconductor layer 307 is deposited on top of the first conductor layer 303, 305 and is in contact with this and the substrate 301. On top of the semiconductor layer, the dielectric layer 309 is deposited.

In step 207, the semiconductor layer and the dielectric layer are patterned or structured together. Specifically, both the semiconductor and the dielectric layer are patterned in a single operation or step. Thus, the same mask is applied to both layers and the two layers will end up having substantially the same pattern.

In the preferred embodiment, the patterning of the semiconductor and dielectric layers is by a photolithographic process. In the preferred embodiment, the dielectric layer is chosen such that the dielectric layer may also function as a photoresist layer. For example, HPR504 may be used for the dielectric layer. In this embodiment, the structure is exposed to UV-light via a contact mask and then developed and rinsed. The patterning of the dielectric and semiconductor layers is then achieved by a conventional etching process such as by Reactive Ion Etching (RIE) with fi. $Ar/O_2$ gas.

Thus, patterning or structuring of the semiconductor-dielectric stack is extremely simple for the described device, as the used dielectric material is photosensitive, and therefore acts as the resist for etching the semiconductor. This obviates the requirement of an additional photoresist layer on top of the stack.

If the substrate is a polymer foil, such as polyimide, the etching may extend into the substrate. There are several ways to limit the negative impact thereof. First of all, the etching times and conditions can be optimized. The properties and thicknesses of the semiconductor layer and the dielectric layer are well-known, and thus is optimization possible. Secondly, an etch stop layer can be provided on the substrate or be part of the substrate. Etch stop layers are known per se. Preferably use is made of an electrically insulating material, therewith preventing any capacitive coupling or short-circuitry between the second conductor layer and the etch stop layer.

Particularly suitable materials for etch stop layers are polymers filled with particles, particularly nanoparticles. Suitable polymers include polyimide, polystyrene, polyimide, polyethyleneterephtalate and so on. Suitable nanoparticles include carbon black, $SiO_2$, $TiO_2$, $BaTiO_3$, ferrites, as well as other inorganic compounds and particularly oxides. The nanoparticles may have a diameter in the order of 1 nm up to 500 nm. Such polymers filled with nanoparticles have the following advantageous properties: they can be used as etch stop, the surface of the layer is relatively flat, therewith allowing direct deposition of the second conductor layer, the layer is flexible, and the polymer can be chosen so that the resulting layer has a thermal coefficient of expansion that is comparable to the substrate and to the other layers. It is a further advantage, that with a suitable choice of the particles, the resulting etch stop layer may inhibit radiation as well, so as to protect the organic semiconductor layer against radiation that leads to degradation.

In the preferred embodiment, the organic semiconductor layer and the dielectric layer is removed from areas not associated with components of the field effect transistor arrangement or with crossing conductors of the first and second conductor layer.

In contrast to conventional methods, the patterning of the semiconductor layer is in the preferred embodiment combined with the process of making the vias and interconnects in the dielectric layer. This reduces the number of masks required by the process from four to three which results in a significant cost reduction of the manufacturing process. Preferably, the dielectric layer is removed everywhere except for the transistor area and the area of the crossings between the two conducting layers. An additional advantage is that it increases the mechanical flexibility of the device, as removal of the dielectric layer reduces the stress and consequently the chance of cracks and film peeling.

Figure 4:
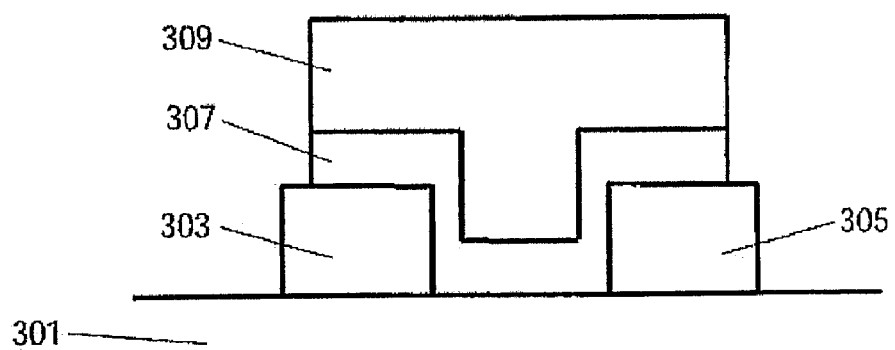
FIG. 4 shows a cross section of the field effect transistor structure following patterning of the dielectric and semiconductor layer in accordance with an embodiment of the invention.

FIG. 4 shows a cross section of the FET structure 300 following patterning of the dielectric and semiconductor layer in accordance with an embodiment of the invention. Hence, FIG. 4 illustrates a cross section of the FET structure following step 207. As can be seen in FIG. 4, the semiconductor and dielectric layers 307, 309 have been reduced to the area above the source and drain electrodes.

In step 209, a patterned second conductor layer is deposited on the patterned dielectric layer. In the preferred embodiment, the second conductor layer accommodates a gate of the field effect transistor. In the preferred embodiment, a patterned gold gate layer is directly applied by evaporation through a shadow mask. However, in other embodiments, a two stage process of application of a conductive layer followed by patterning may be used. In some embodiments an organic conductor material may be used for the gate.

Figure 5:
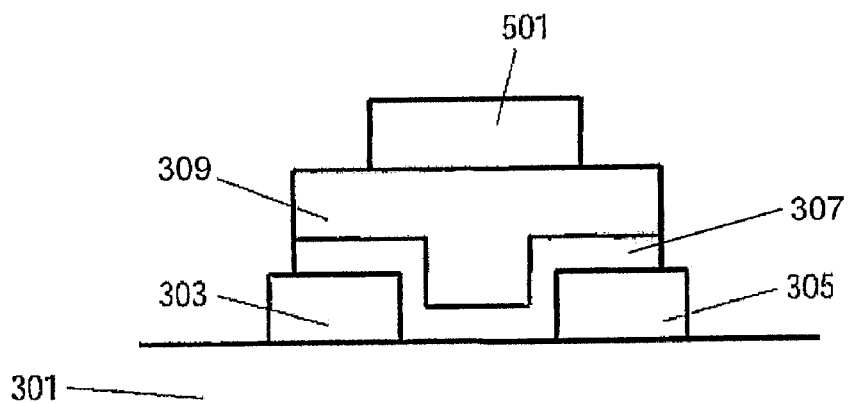
FIG. 5 shows a cross section of the field effect transistor structure following deposition of the second conductor layer in accordance with an embodiment of the invention.

FIG. 5 shows a cross section of the FET structure 300 following deposition of the second conductor layer in accordance with an embodiment of the invention. Hence, FIG. 5 illustrates a cross section of the FET structure following step 209.

As can be seen in FIG. 5, a gate electrode 501 has been provided on top of the dielectric layer. Thus a FET has been formed having a channel between a source 303 and drain 305 electrode and an overlaying gate 501. Thus, a very simple manufacturing process using only three masks while structuring both the semiconductor and dielectric layer is achieved for a top gate structure organic FET.

FETs may be produced having a very clean integration of the semiconductor and dielectric layer whereby high performance of the organic FET can be achieved. Experiments have shown that a mobility of $2.10^{-2}$ cm$^2$/Vs can be achieved. This is comparable to or better than the conventional bottom gate structures under the same conditions.

In the preferred embodiment, the insulation layer is removed from all areas not associated with components of the field effect transistor arrangement or with crossing conductors of the first and second conductor layer. Hence, the dielectric layer and thus the semiconductor layer is maintained when interconnects of the two layers cross in order to provide the required isolation between these.

Figure 6:
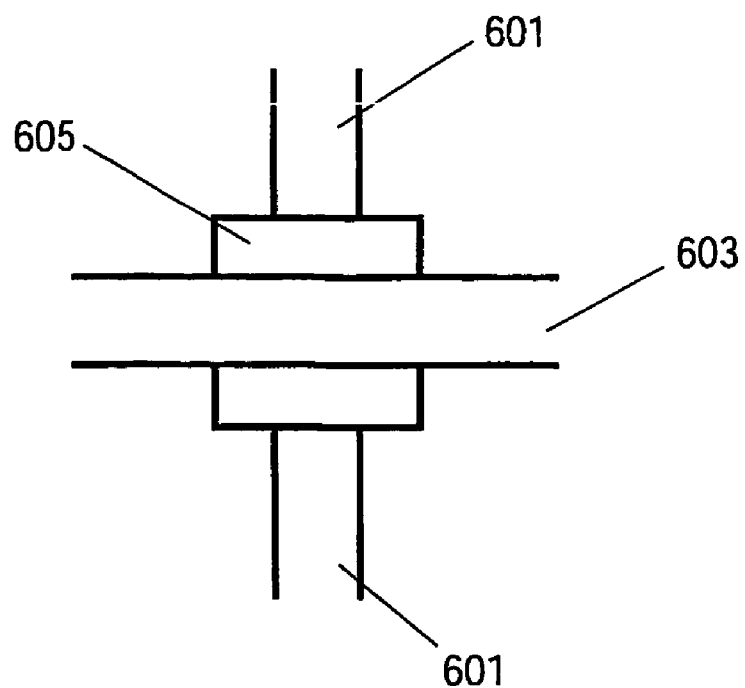
FIG. 6 shows a top-view of a crossing of two conductors of the different conductor layers.

FIG. 6 shows a top-view of a crossing of two conductors of the different conductor layers. A first conductor 601 of the first lower conductor layer crosses substantially perpendicularly under a second conductor 603 of the upper second conductor layer. The two conductors 601, 603 are isolated by an area or island 605 of dielectric material of the dielectric layer.

Figure 7:
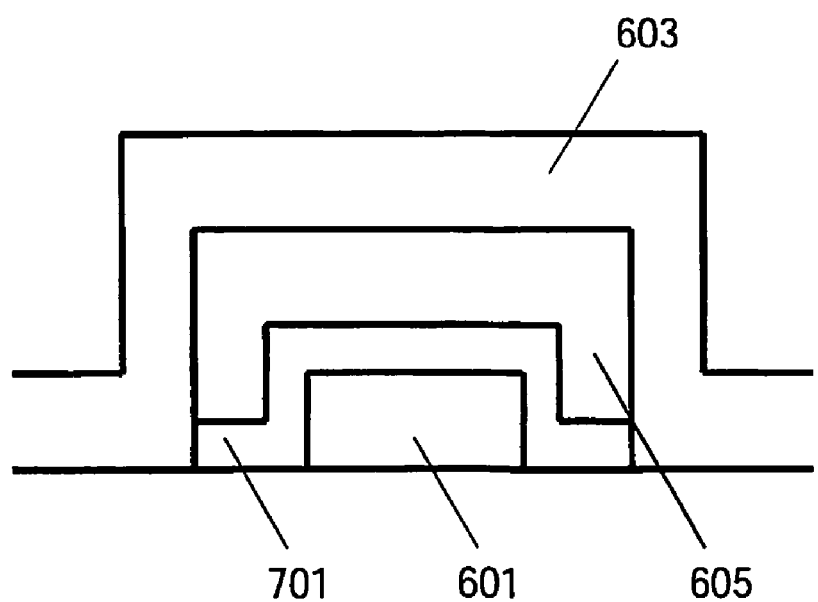
FIG. 7 shows a cross-section view corresponding to the top view of FIG. 6.

FIG. 7 shows a cross-section of the crossing of the two conductors 601, 603 of the different conductor layers. As shown in FIG. 7, the island 605 of dielectric material causes an island 701 of semiconductor material to remain. However, this semiconductor island is in contact with both conductors 601, 603 and accordingly a leakage path is formed between the two conducting layers. This leakage path can be made as small as required by choosing the right geometry of the dielectric-semiconductor island 605, 701. An extreme case, where the leakage is completely removed, could be the extension of the island completely under the top conducting electrode 603.

Figure 8:
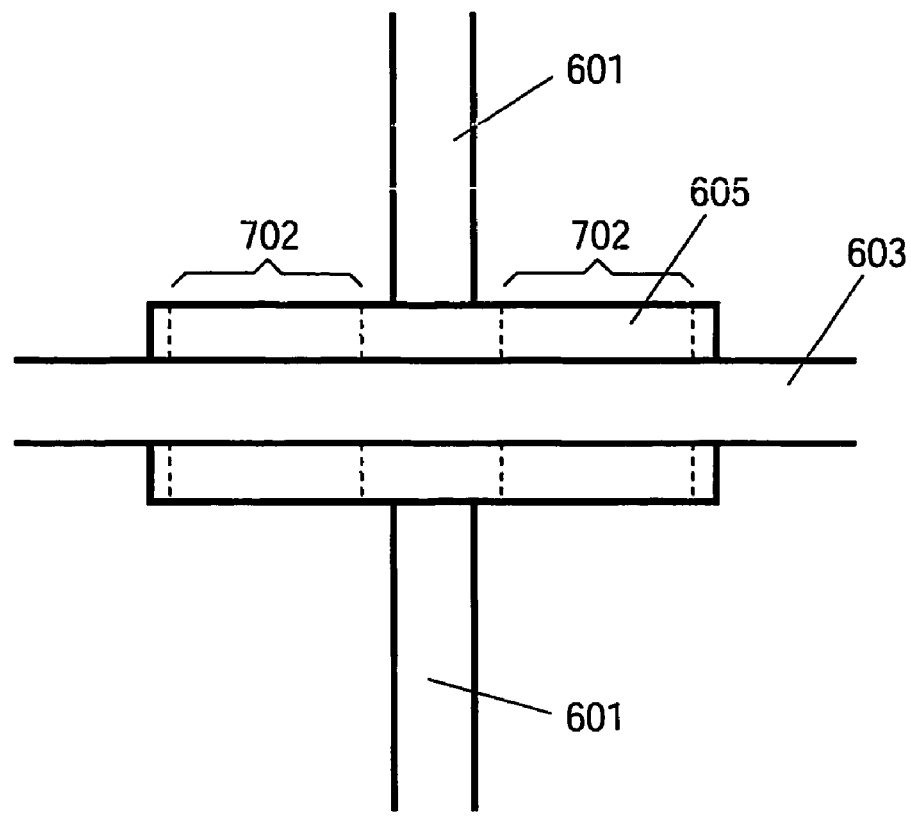
FIG. 8 shows a top-view of a second embodiment of a crossing of two conductors of the different conductor layers.
Figure 9:
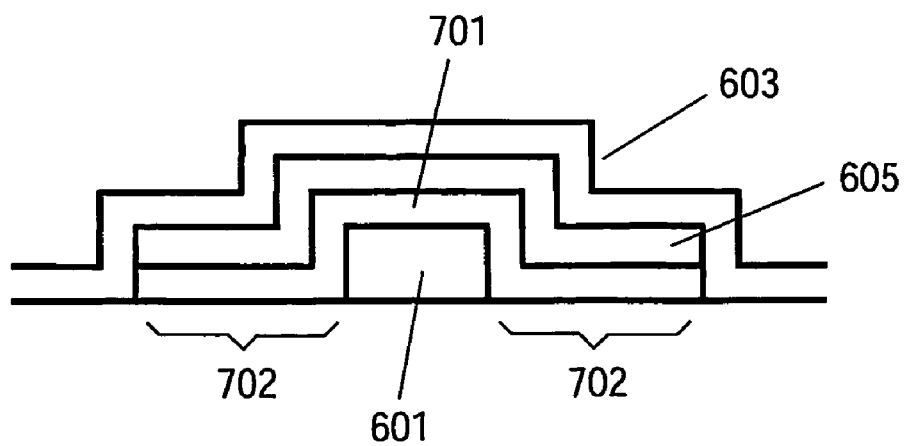
FIG. 9 shows a cross-section view corresponding to the top view of FIG. 8.

FIG. 8 shows schematically a top view of a second embodiment of the crossing of two conductors 601,603 of the different conductor layers. FIG. 9 shows the corresponding cross-sectional view. The reference numbers used herein are identical to those in FIG. 6 and 7, as far as possible. In this embodiment the island 605 of dielectric and semiconductor layers is elongated with respect to the island shown in FIG. 6. This is done in order to provide protection zones 702. These protection zones 702 provide a minimal lateral distance between the first conductor 601 in the first conductor layer and the second conductor 603 in the second conductor layer. The protection zone is in this example about the 5.0 micrometer. The width of the second conductor is about 2.0 micrometer. Pentacene has a conductivity of $1,3.10^{-4}$ S/cm. This results in a resistance of about $2.10^{4}$ Ω. As the voltage differences between the first conductor 601 and the second conductor 603 will only be of substantial magnitude at short periods, this is not problematic.

Thus, in accordance with the preferred embodiment, a single organic FET may be produced by the described manufacturing process or an organic FET arrangement comprising a plurality or multitude of FETs may be manufactured. In some embodiments, an integrated circuit is manufactured comprising both semiconductor components as well as interconnects required to achieve a desired functionality.

In some embodiments, the FET arrangement may used in a display or electroluminescent device. Specifically, pixel FETs may be produced in accordance with the described method. In this case, the FET arrangement preferably comprises a number of FETs arranged in a matrix format comprising rows and columns. The gate of each pixel FET is preferably connected to a row electrode and the source of each FET is preferably connected to a column electrode. Each individual pixel FET may then be activated and provided with the appropriate charge by a scanning operation as is well known to the person skilled in the art.

For some display application, at least one of the substrate is transmissive and preferably sufficiently transparent for an image to be seen through the layer. This allows for the image to be seen from the corresponding direction by light penetrating the appropriate layer.

In the preferred embodiment for a display application, the manufacturing process further comprises the step of applying an electrophoretic electro-optical layer. The electrophoretic electro-optical layer will comprise charged particles, which will move dependent on the charge applied to the pixel transistor thereby creating a visual coloration of the pixel in accordance with the applied charge.

In the preferred embodiment, the manufacturing further comprises the step of applying a protective layer. For example, a protective layer of polymethylmethacrylate, polyvinylalcohol, polyvinylphenol, polyacrylate, polystyrene, polyvinylchloride, polyesters, polyethers, benzocyclobutene, polyinide, epoxides, glassfilled polymers or inorganic dielectrics may be applied by spin coating following the application of the second conductive layer or the electrophoretic layer. This, protective layer will increase the mechanical resistance of the device.

The invention can be implemented by any suitable apparatus and in any suitable form. The elements and components for implementing an embodiment of the invention may be physically, functionally and logically implemented in any suitable way. Indeed the functionality may be implemented in a single unit, in a plurality of units or as part of other units.

As such, the invention may be implemented in a single unit or may be physically and functionally distributed between different units.

Although the present invention has been described in correction with the preferred embodiment, it is not intended to be limited to the specific form set forth herein. Rather, the scope of the present invention is limited only by the accompanying claims. In the claims, the term comprising does not exclude the presence of other elements or steps.

Furthermore, although individually listed, a plurality of means, elements or method steps may be implemented by e.g. a single unit. Additionally, although individual features may be included in different claims, these may possibly be advantageously combined, and the inclusion in different claims does not imply that a combination of features is no feasible and/or advantageous. In addition, singular references do not exclude a plurality. Thus references to "a", "an", "first", "second" etc do not preclude a plurality.

The invention claimed is:

1. A method of manufacturing an electronic device, in which method at least one field effect transistor is provided on a substrate, which provision of the at least one field effect transistor comprises the steps of:
    applying a patterned, first conductor layer on the substrate;
    applying an organic semiconductor layer on the first conductor layer;
    applying a dielectric layer on the semiconductor layer;
    patterning the organic semiconductor layer and the dielectric layer together; and
    applying a patterned second conductor layer on the patterned dielectric layer.

2. A method as claimed in claim 1 wherein the step of patterning the organic semiconductor layer and the dielectric layer comprises removing the organic semiconductor layer and the dielectric layer from areas not associated with the at least one field effect transistor and from areas not associated with crossing conductors of the first and second conductor layer.

3. A method as claimed in claim 1 wherein the step of applying an organic semiconductor layer on the first conductor layer comprises applying an organic semiconductor or a precursor thereof by spin coating.

4. A method as claimed in claim 1 wherein the dielectric layer comprises an initiator sensitive for actinic radiation and functions after irradiation as a mask for the patterning of the semiconductor layer.

5. A method as claimed in claim 1, comprising the additional step of providing an electro-optical layer so as to provide a display arrangement.

6. A method as claimed in claim 2, wherein the said areas associated with a field effect transistor and/or the said areas associated with crossing conductors include protection zones providing a minimal lateral distance between a first conductor in the first conductor layer and a second conductor in the second conductor layer.

7. A method as claimed in claim 3, wherein the dielectric layer comprises a photoresist material.

8. A method as claimed in claim 7 wherein the substrate is substantially transparent.

9. An electronic device comprising a plurality of field effect transistor on a substrate and an interconnect structure so as to connect the transistors mutually and/or to an output terminal, the fleid effect transistors and at least part of the interconnect structure being provided in a stack of:
    a patterned first conductor layer applied on the substrate;
    an organic semiconductor layer applied on the first conductor layer;
    a dielectric layer applied on the semiconductor layer;
    a patterned second conductor layer applied on the dielectric layer;
    wherein the semiconductor layer and the dielectric layer are provided in a substantially identical pattern.

10. An electronic device as claimed in claim 9, wherein the semiconductor layer and the dielectric layer are absent from areas not associated with the field effect transistors and from areas not associated with crossing conductors of the first and second conductor layer.

* * * * *